United States Patent
Torin

(10) Patent No.: US 7,816,904 B2
(45) Date of Patent: Oct. 19, 2010

(54) MODULATION SIGNATURE TRIGGER

(75) Inventor: Shigetsune Torin, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 411 days.

(21) Appl. No.: 11/869,637

(22) Filed: Oct. 9, 2007

(65) Prior Publication Data

US 2009/0094495 A1     Apr. 9, 2009

(51) Int. Cl.
   *G01R 23/16*     (2006.01)
(52) U.S. Cl. .................... 324/76.12; 324/76.77
(58) Field of Classification Search ........... 324/76.12
   See application file for complete search history.

(56) References Cited

U.S. PATENT DOCUMENTS

| | | | | |
|---|---|---|---|---|
| 4,096,397 | A * | 6/1978 | Dreiling | 327/51 |
| 4,403,184 | A * | 9/1983 | Witt et al. | 324/76.22 |
| 4,491,930 | A * | 1/1985 | Hyatt | 708/3 |
| 4,686,655 | A * | 8/1987 | Hyatt | 367/59 |
| 4,797,936 | A | 1/1989 | Nakatsugawa et al. | |
| 4,914,418 | A * | 4/1990 | Mak et al. | 370/201 |
| 5,341,435 | A * | 8/1994 | Corbett et al. | 382/103 |
| 5,841,286 | A * | 11/1998 | Stoops | 324/511 |
| 7,009,170 | B2 * | 3/2006 | Dobbs et al. | 250/226 |
| 7,286,755 | B1 * | 10/2007 | Goodwill et al. | 398/26 |
| 7,349,457 | B2 * | 3/2008 | Stoddard et al. | 375/131 |
| 2006/0176151 | A1 | 8/2006 | Ems et al. | |
| 2007/0100548 | A1 * | 5/2007 | Small | 701/214 |
| 2009/0082982 | A1 | 3/2009 | Cain | |

FOREIGN PATENT DOCUMENTS

| | | |
|---|---|---|
| EP | 1669764 A1 | 6/2006 |
| EP | 1672376 A1 | 6/2006 |
| EP | 1724595 A1 | 11/2006 |
| EP | 1826576 A2 | 8/2007 |

OTHER PUBLICATIONS

Sivula A Ed—Institute of Electrical and Electronics Engineers: "Next-generation devices and networks bring opportunities and challenges," Proceedings International Test Conference 2003. (ITC). Charlotte, NC, Sep. 30-Oct. 2, 2003; [International Test Conference], New York, NY: IEEE, US, vol. 1, Sep. 30, 2003, p. 1319, XP010685369, ISBN: 978-0-7803-8106-3.

Da Silva M: "Trigger-Capture-Analyze: Three Steps Toward Understanding Today's Complex RF Signals," Microwave Journal, Horizon House Publications, Norwood, MA, US, vol. 47, No. 2, Mar. 1, 2004, p. 22, 24, 26, 28, 30, 32, 34, 36, XP008062558, ISSN: 0192-6225.

* cited by examiner

*Primary Examiner*—Thomas Valone
(74) *Attorney, Agent, or Firm*—Matthew D. Rabdau; Michael A. Nelson

(57) ABSTRACT

A trigger generator and trigger method are provided for determining whether or not a signal under test matches a modulation signature. The modulation signature may be provided as a magnitude signature, a phase signature or both. When the magnitude values, phase values, or both of a signal under test are the same as their respective modulation signature, an error computation will be close to zero. If this value is within a threshold value, a trigger signal or other indication of a match is produced.

5 Claims, 10 Drawing Sheets

Input Signal

Signature

Not Good
Matching

Input Signal

Signature

Good Matching

MODULATION SIGNATURE TRIGGER

BACKGROUND

Embodiments of the present invention relate to test and measurement instrumentation, and more particularly to providing a trigger signal based upon a detection criteria.

Referring now to FIG. 1 (prior art), a real-time spectrum analyzer 10 is shown having an input processor 20 for receiving an input RF signal, or other signal of interest. The input processor 20 typically includes a lowpass filter 22 followed by a mixer 24 that converts the filtered input signal to an intermediate frequency (IF) signal using a local oscillator 26. The IF signal is passed through a bandpass filter 28 and then input to an analog-to-digital (A/D) converter 30 to provide a digital signal for further processing. The digital signal is input to a digital IF quadrature processor 31 to derive In-phase (I) and Quadrature-phase (Q) signals from the digital signal. The I and Q signals are input to a processor 32 for real-time processing for display on a monitor 34, which provides a representation of frequency vs. time. The I and Q signals are also input to an acquisition memory 36 and to a trigger generator 40. When the trigger generator 40 detects an event, a trigger is generated that causes acquisition memory 36 to hold data from before, after and/or during the trigger event for subsequent processing. Subsequent processing may be performed by the processor 32, or by additional processors (not shown). The subsequent processing may be used for real-time analysis or non-real-time analysis, such as post process analysis. The processor 32 may be implemented as a digital signal processor (DSP), an ASIC, an FPGA, or a general purpose processor, such as those used in general purpose, or personal computers.

In response to specified conditions that define a trigger event, the trigger generator outputs a trigger signal. A memory controller is said to capture I-Q data in response to the trigger signal. In some embodiments, the act of acquiring, or capturing, I-Q data is accomplished by holding data that is already stored in the memory, such that it will not be overwritten during the normal acquisition process. In other embodiments, the I-Q data may be transferred from a temporary memory, into a more permanent memory, or other storage medium for subsequent processing. Depending upon the desired action, I-Q data from some period prior to the trigger signal, some period subsequent to the trigger signal, or a combination thereof, may be captured, or stored, in response to the trigger signal. In some embodiments, the I-Q data corresponding to the signal that met the defined trigger event are also captured and stored.

The word trigger may generally refer interchangeably to the trigger circuit, the trigger signal, and in some instances the type of signal event that results in a trigger signal. Triggers are becoming more and more sophisticated as modem communications systems have become more complex. There is a growing desire to identify a variety of signals, or signal anomalies, that occur very infrequently in signals that may be present for very long periods of time. In these systems, while a problem may be known to exist, the source of the problem may be difficult to isolate or identify. This is especially true when the problem is intermittent. Long data records, on the order of hours or even day, may have to be examined to try to find the data corresponding to an event.

As signals become more complex, simple level triggers in the time domain, and even frequency mask triggers in the frequency domain are insufficient for providing the ability to trigger on more complex signals, or signal anomalies.

SUMMARY

Accordingly a test and measurement instrument is provided comprising a modulation signature trigger. The modulation signature trigger provides a means for comparing an input signal against a modulation signature, such as a magnitude signature or a phase signature. A detector compares the magnitude values, or phase values against a corresponding modulation signature. When a match is indicated, such as by an error computation being produced that is within a threshold value, a trigger signal or other indication is produced. In some embodiments, the signal under test may be captured, or acquired, based upon the trigger signal. In other embodiments, a marker may be associated with stored signal data when a match is indicated.

DETAILED DESCRIPTION

A real time spectrum analyzer, according to an embodiment of the present invention, has the ability to capture, or acquire, a set of I and Q data samples as the result of a triggering event. In an embodiment of the present trigger system, a trigger event can be based upon Magnitude-Phase data set. A user can provide an expected or desired waveform in the time-domain before the measurement and the instrument compares the incoming data samples and evaluates whether there is a match with the provided waveform for each sample.

Figure 1:
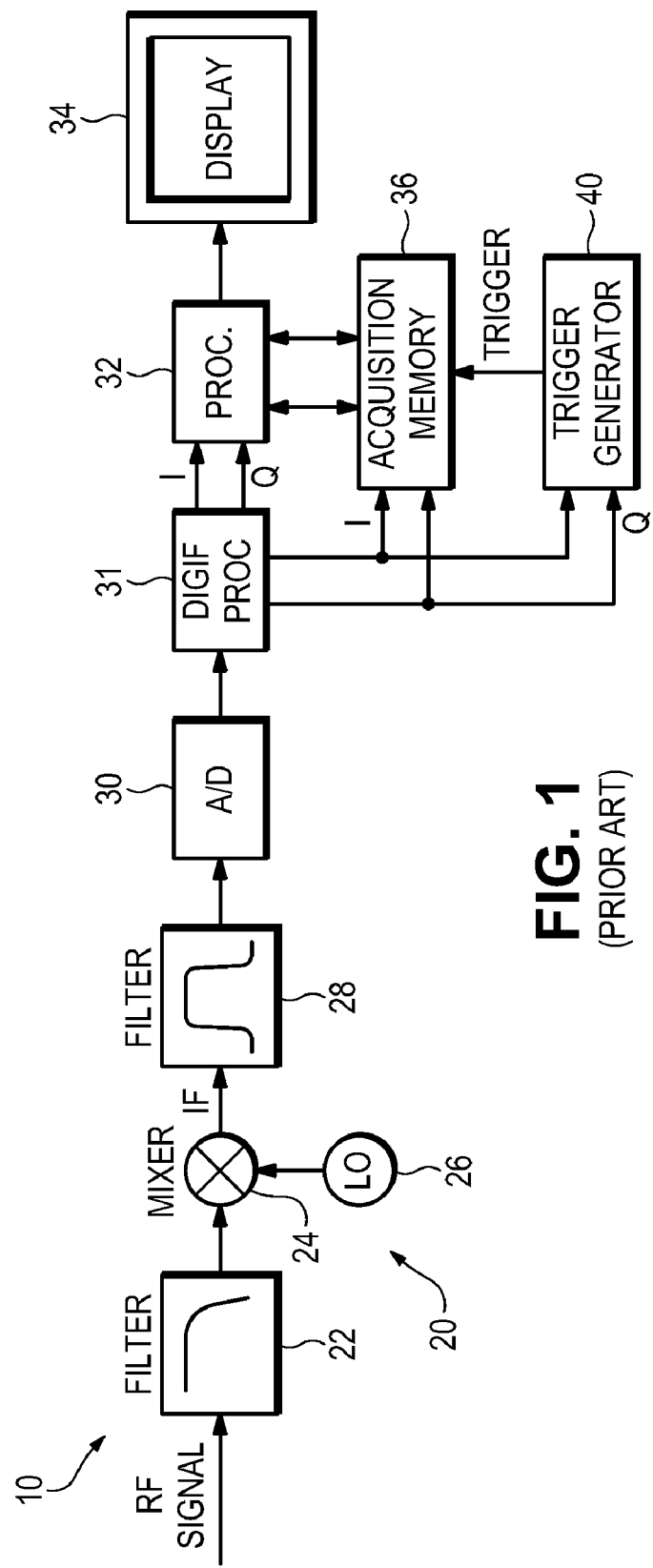
FIG. 1 (prior art) shows a test and measurement instrument in the form of a real-time spectrum analyzer.
Figure 2:
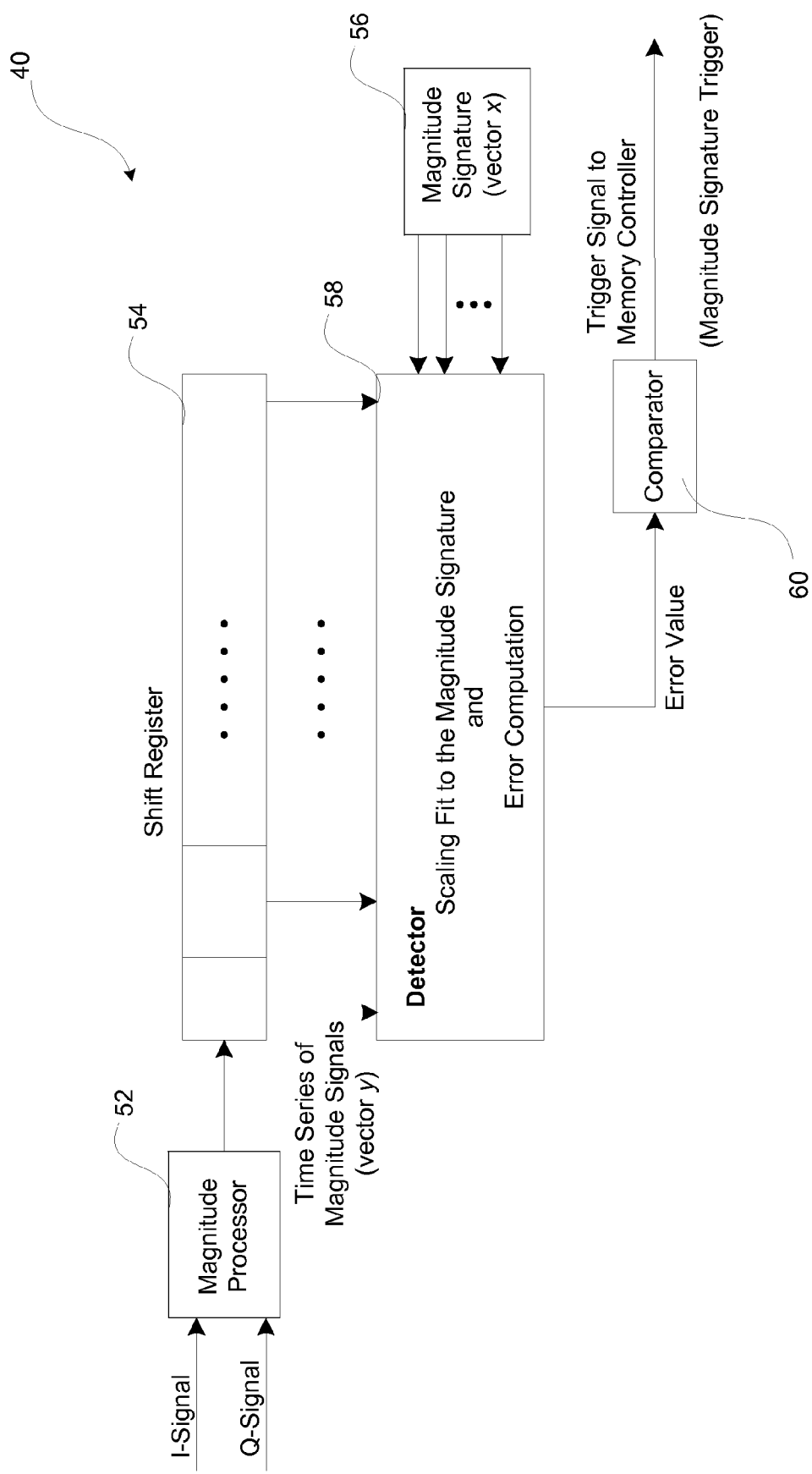
FIG. 2 illustrates a modulation signature trigger using a magnitude signature.

FIG. 2 illustrates a trigger generator 40 based on comparing magnitude data. A trigger based on magnitude data is well suited to finding a particular signature within an amplitude modulated signal (AM signal). In one embodiment, a magnitude processor 52 computes the magnitude based upon the I-signal and the Q-signal data samples to provide magnitude values for comparison against the user provided waveform. The magnitude values are provided to a shift register 54 that shifts the magnitude values so that are compared against a magnitude signature 56 that was provided, or selected, by the user. A comparison is made to determine the presence or absence of a match each time the magnitude values are shifted. This allows the incoming magnitude to be effectively moved across the desired pattern to see if there is a match with the desired magnitude signature. The detector 58 computes a sum of the squared magnitude errors. If everything was ideal and the incoming signal were exactly the same as the signature, the result of the magnitude errors would be zero. However, when dealing with real world signals a threshold is used so that when the result is sufficiently close to zero a comparator 60 generates a trigger signal. The threshold value may be predetermined for the instrument, or alternatively the user may set the threshold value. If the threshold value is set too high the trigger generator 40 will trigger on false positives. If the threshold value is set too low desired signals may be missed.

When making measurements, the magnitude values from the signal under test (SUT) are not necessarily at the same scale as the magnitude signature. The signal under test can be scaled, have some constant level shift, or both, relative to the signature. Accordingly, in an embodiment of the present trigger system, the detector 58 provides a scaling factor and scales the magnitude signature so that the incoming signal and the scaled magnitude signature are matched. In one embodiment, the scaling factor is estimated to minimized the estimation error (vector e). In another embodiment, a shift level is estimated to minimize the estimation error. In a further embodiment both a scaling factor and a shift level are estimated to minimize the estimation error. In one embodiment of the present invention, a Least Squares Estimator is used to find this scaling factor. For example, the following formula can be used as a basis for minimizing the error:

$$\begin{bmatrix} y_0 \\ y_1 \\ \vdots \\ y_{N-1} \end{bmatrix} = \begin{bmatrix} x_0 & 1 \\ x_1 & 1 \\ \vdots & \vdots \\ x_{N-1} & 1 \end{bmatrix} \begin{bmatrix} a \\ b \end{bmatrix} + \begin{bmatrix} e_0 \\ e_1 \\ \vdots \\ e_{N-1} \end{bmatrix}$$

where the sampled signal is vector y, the signature is vector x, the scaling factor is a, the constant level shift, or offset, is b. This error may also include thermal noise in the signal. In an alternative embodiment, the incoming signal is scaled and/or offset to match the magnitude signature.

Figure 3A:
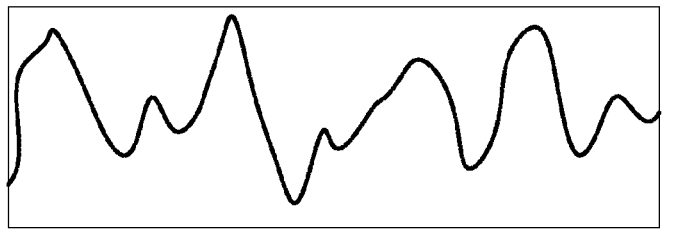
FIGS. 3A and 3B illustrate an idealized comparison of a signal with a signature.
Figure 3A:
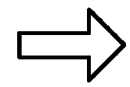
Figure 3A:
Figure 3B:
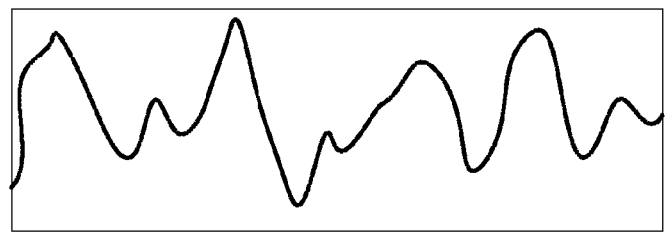
Figure 3B:
Figure 3B:
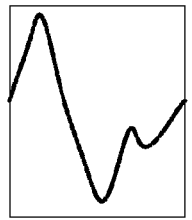
Figure 4:
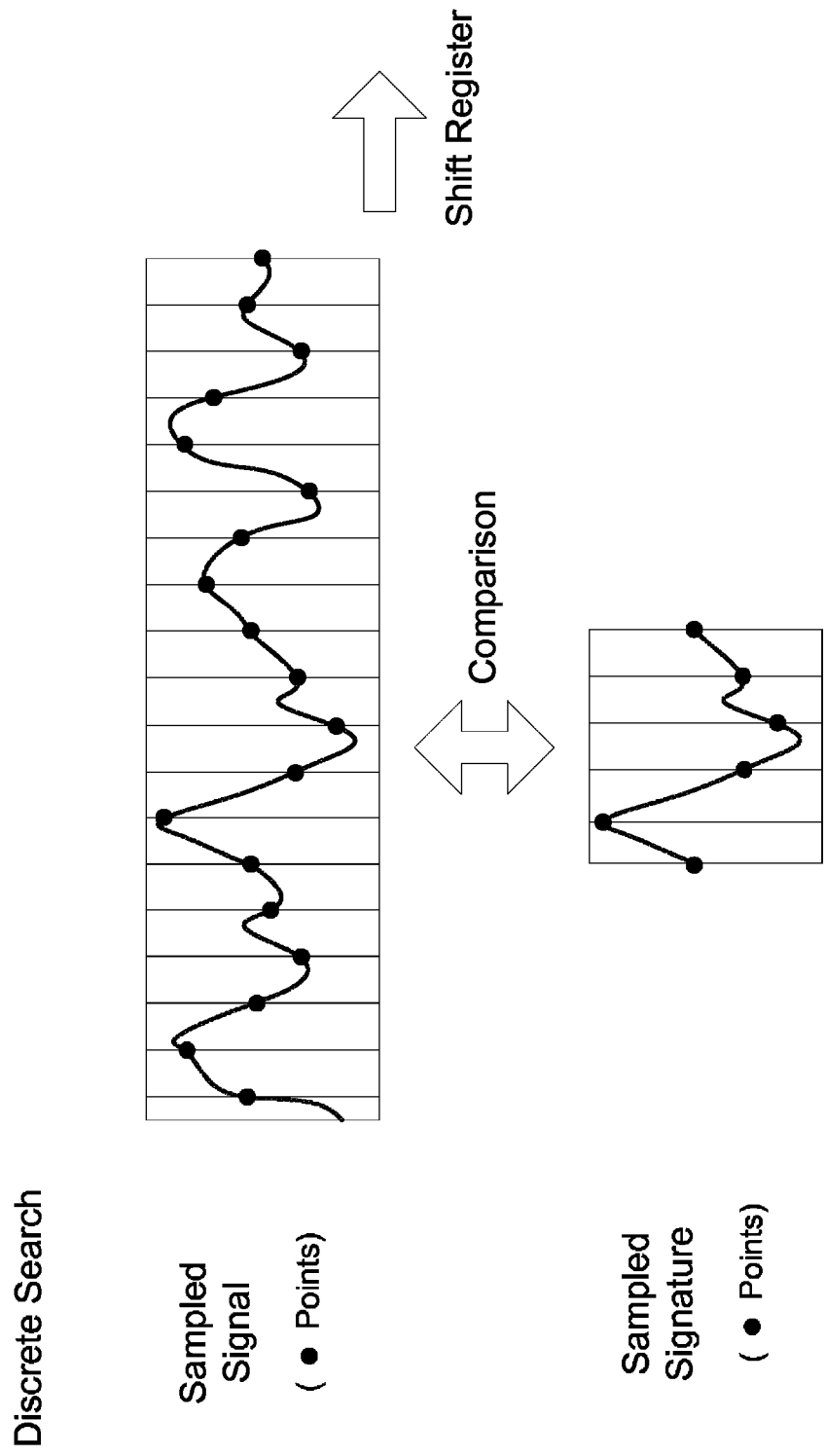
FIG. 4 illustrates a comparison based upon discrete sampled data points.

FIGS. 3A and 3B shows an idealized comparison to illustrate the basic operation of an embodiment of the present invention. In FIG. 3A an input signal corresponding to an idealized signal under test is compared against a modulation signature, which could be either magnitude or phase. The input signal is moved across the signature until the region of the input signal that corresponds to the modulation signature is aligned with the modulation signature, as shown at FIG. 3B. At this point, in the ideal case the two signals would match identically, producing an error computation of zero, which would then be used to provide a trigger signal. In the ideal case, the comparison would be done using a continuous time signal and a continuous signature. In reality, this is impractical. When measuring signal under test there may be unknown factors such as scaling and constant level shift, because the signal under test is not generated by the measurement instrument, and in some cases the user may not have control of the source of the signal under test. Furthermore, since it is impractical to provide a comparison of continuous signals and signature, the signal is sampled, producing a sequence of points that are then compared to the signature, as shown in FIG. 4. As shown, in FIGS. 3 and 4, the input signal under test is moved over the signature until a match, if any, is detected. This operation corresponds to the shift register 54 of FIG. 2 shifting the signal values. This would allow the input signal to be shifted as new signal values are received. In an alternative embodiment, portions of the signal under test could be provided and the signature could be shifted to locate a match.

Once a match is found, a trigger signal is generated to identify or acquire the signal. In some embodiments the signal under test is being written to an acquisition memory or other storage as I and Q signal, and the trigger signal causes this memory to be saved, rather than overwritten. In a further embodiment, the trigger signal may cause the relevant portion of the acquisition memory to be stored to a longer term storage device such as a hard drive. Depending upon the settings, the trigger signal may cause signal information from before, during, and/or after the trigger causing event to be acquired, or saved. In an embodiment of the present invention, signal information related to the portion of the signal under test that caused the trigger signal to be produced is acquired.

Figure 5:
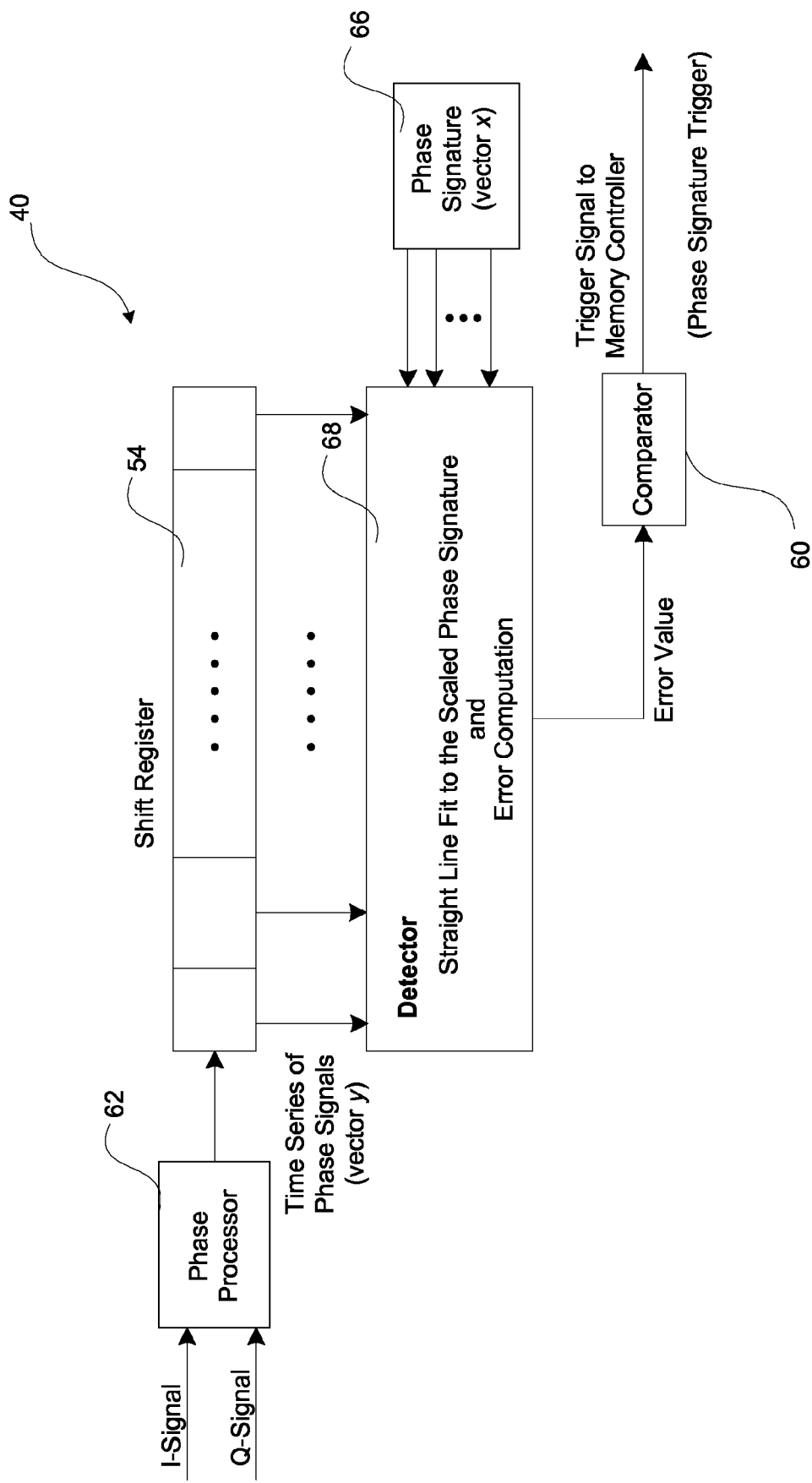
FIG. 5 illustrates a modulation signature trigger using a phase signature.

In another embodiment, shown in FIG. 5, phase information is used as the basis for the trigger. This type of trigger would be useful for example to trigger on the signature of a frequency modulate (FM) signal. The magnitude trigger described above is inadequate for FM signals, because FM signals have a more constant magnitude envelope. However, the phase information can be used to provide a signature trigger for FM signals. As shown in FIG. 5, phase values are produced in a phase processor 62 based upon I and Q input signals obtained from the signal under test. The phase values are provided to a shift register 54 that shifts the phase values so that they are compared against a phase signature 66 that may be provided, or selected, by a user. A comparison is made to determine the presence or absence of a match each time the phase values are shifted. This allows the incoming phase values to be effectively moved across the desired pattern to see if there is a match with the phase signature. The detector 68 provides a straight line fit to the scaled phase signature and computes the error. If everything were ideal, the result of the phase error would be zero when there was a match. However, when dealing with real world signals, a threshold is used so that when the result is sufficiently close to zero a comparator 60 generates a trigger signal. As described above in connection with the magnitude signature trigger, the threshold value may be preset for the instrument, or the user may be able to define the threshold value.

For phase or frequency modulated signals, the modulation depth can be scaled or have some constant level shift. Furthermore, there may be a frequency offset between signal and signature. By estimating these possibly unknown parameters to minimize the estimation error a better comparison can be made with the phase signature. The following relationship can be used to estimate a scaling factor, frequency offset, and constant phase shift (or offset):

$$\begin{bmatrix} y_0 \\ y_1 \\ \vdots \\ y_{N-1} \end{bmatrix} = \begin{bmatrix} x_0 & t_0 & 1 \\ x_1 & t_1 & 1 \\ \vdots & \vdots & \vdots \\ x_{N-1} & t_{N-1} & 1 \end{bmatrix} \begin{bmatrix} a \\ \Delta f \\ b \end{bmatrix} + \begin{bmatrix} e_0 \\ e_1 \\ \vdots \\ e_{N-1} \end{bmatrix}$$

where, the sampled signal is vector y, the signature is vector x, time is vector t, scaling factor is a, frequency offset is $\Delta f$ constant phase shift (or offset) is b, and the error vector is e.

As described above the signature vector x is being adjusted by estimating the appropriate scaling, frequency offset, and phase shift values. As would be understood by one skilled in the art, it would be similarly possible to estimate similar values to scale the signal vector y instead.

Figure 6:
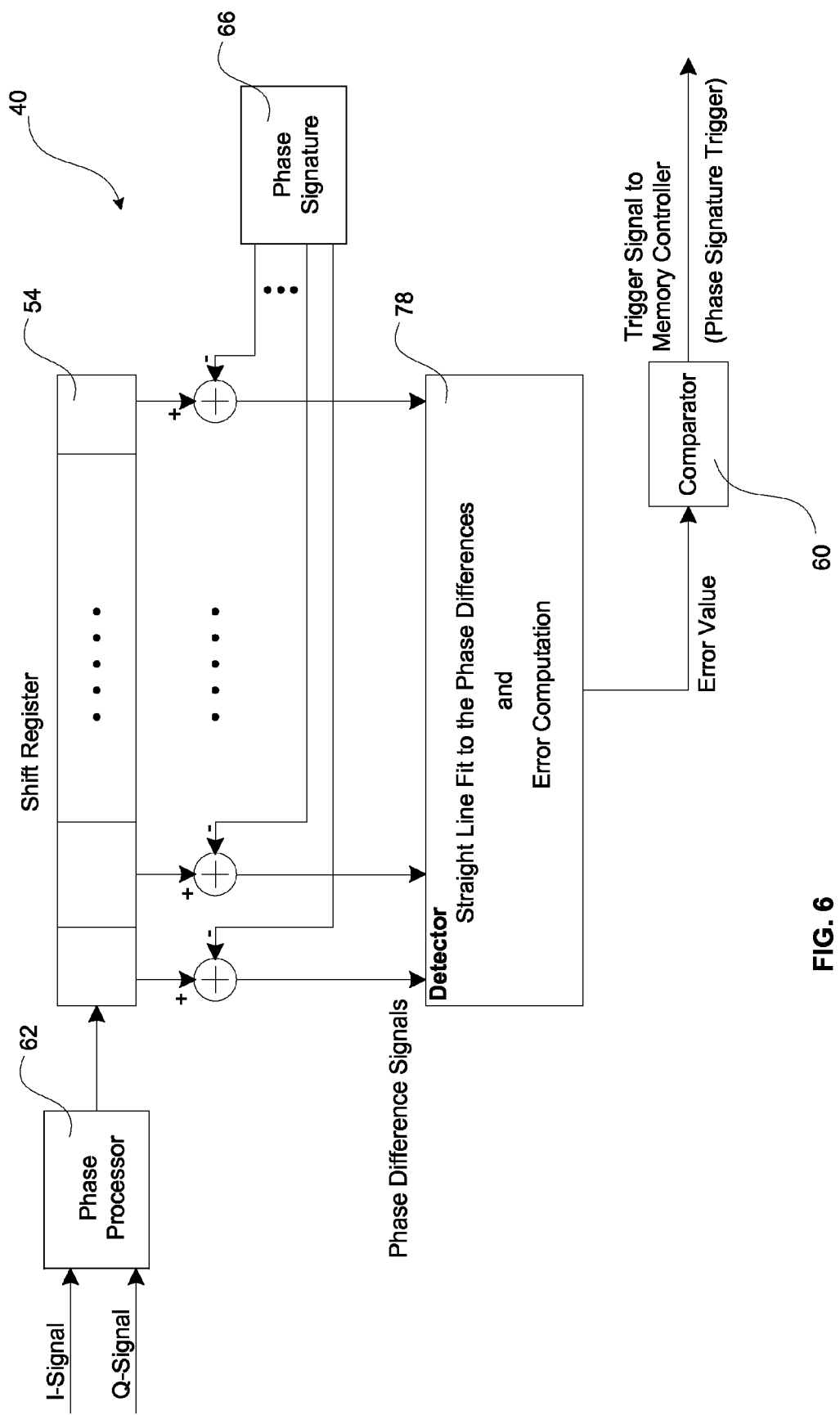
FIG. 6 illustrates a modulation signature trigger using the difference between the phase values of a signal under test and the phase signature.

If the frequency deviation of a signal is known, such as in the case of Minimum Shift Keying (MSK) modulation, an alternative embodiment of the present invention provides a fixed scaling factor a reducing the number of factors that need to be estimated allowing accuracy to be obtained more efficiently. The phase and frequency offset is used to identify the phase signature from the signal under test. As shown in FIG. 6, the phase signature 66 is subtracted from the phase values stored in the shift register. The detector 78 performs a straight line fit to the phase differences and computes the error. If the phase signature and the incoming signal match, the phase error is close to zero. When the phase error is below a threshold value, the comparator 60 will produce a trigger signal.

In several embodiments described above in connection with both magnitude signature and phase signature, a straight line fit is computed as part of the detection. In embodiments of the present invention, a straight line is determined using a Least Square Estimation (LSE). Taking for example formulas having the same form:

$$y = H\theta + e$$

One can estimate the parameter vector, $\theta$, by least square fit to minimize the squared error. The estimator, $\hat{\theta}$, is $\hat{\theta} = \min_{\theta} e^T e$, which can be solved to the equation:

$$\hat{\theta} = (H^T H)^{-1} H^T y.$$

The resulting least squared error (LSE) is $$LSE = \sum_{i=0}^{N-1} e_i^2 = y^T [I - H(H^T H)^{-1} H^T] y$$

where I is the identity matrix. Finally, we can compare the LSE to a given threshold value to determine whether to generate the trigger signal.

Figure 7:
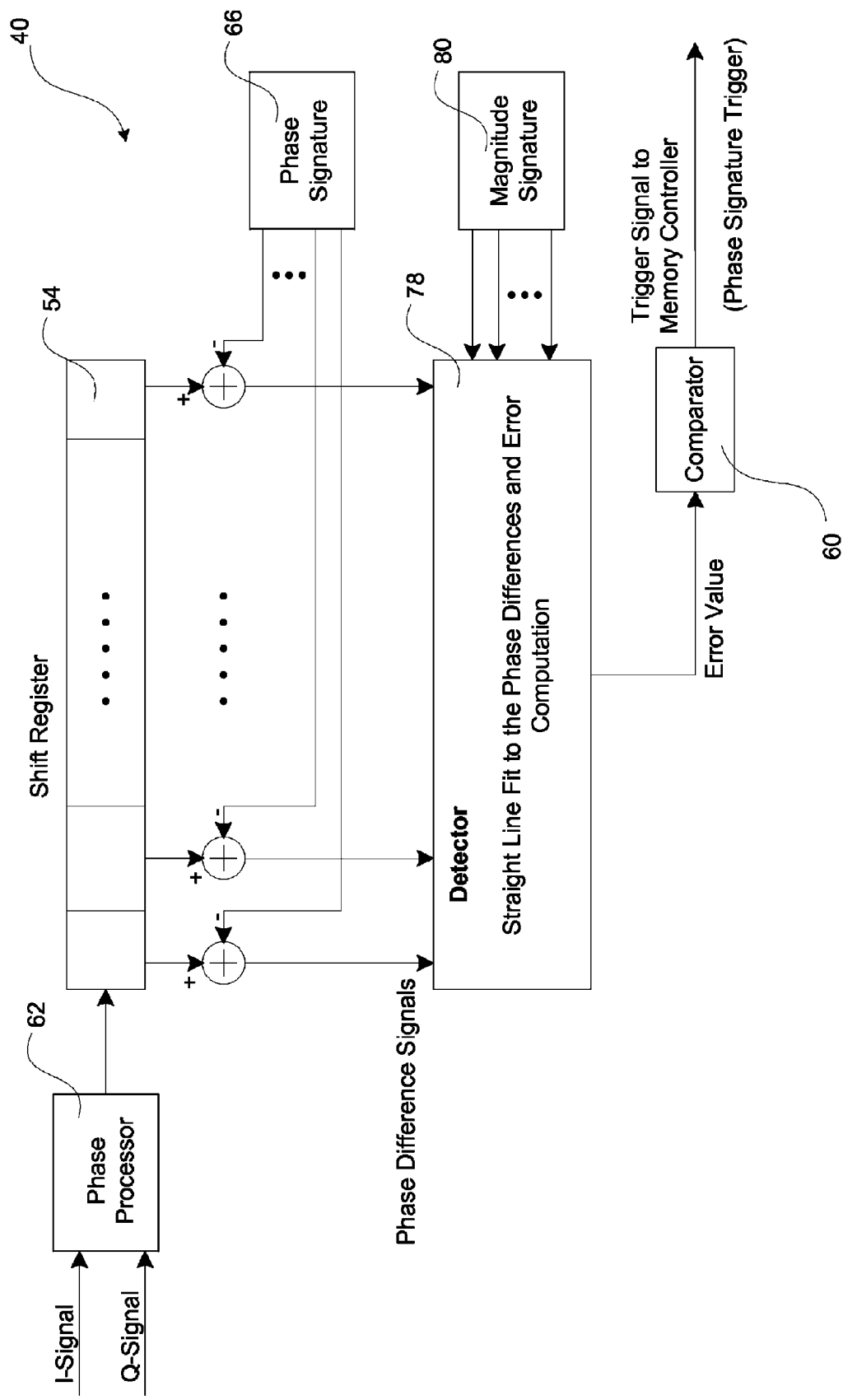
FIG. 7 illustrates a modulation signature trigger as shown in FIG. 6, further providing a magnitude signature to provide weighting factors.

Another embodiment of the present invention is shown in FIG. 7. A phase difference is used as the basis of the trigger calculation in the detector, similar to that described above in connection with FIG. 6. In the present embodiment, magnitude information is used to provide a weighting factor for the phase detection. Using magnitude information to weight the phase detection is useful because the effect of noise in phase information increases when the magnitude decreases. One way to avoid the effects of a poor signal to noise ratio, is to place greater weight on those values corresponding to higher signal magnitudes, which tend to have better signal to noise ratios. The magnitude values used to provide the weighting factors are provided by a magnitude signature 80 that relates to the corresponding the phase signature 66. In one embodiment, a Weighted Least Square Estimation (WLSE) is used. Greater value is associated with those portions of the signal having a larger magnitude signature as opposed small magnitude signature because the larger signal has better Signal to Noise Ratio (SNR). The estimator, $\hat{\theta}_w$ becomes:

$$\hat{\theta} = \min_{\theta} e^T W e$$

where W is a nonsingular symmetric matrix for weighting. It is generally, inverse of error correlation matrix, R. In this case, the diagonal elements are the squared values of the magnitude signature and other elements are zeros if we assume all error elements are independent each other. If the magnitude signature has the form, $$m = [m_0, m_1, \ldots, m_{N-1}]^T,$$

then the matrix W is $$W = \begin{bmatrix} m_0^2 & 0 & & 0 \\ 0 & m_1^2 & & 0 \\ & & & \\ 0 & 0 & & m_{N-1}^2 \end{bmatrix}.$$

The estimator, $\hat{\theta}_w$, is: $\hat{\theta} = (H^T W H)^{-1} H^T W y$ where y is the phase difference vector. The LSE is obtained as:

$$LSE = y^T [W - WH(H^T W H)^{-1} H^T W] y.$$

Figure 8:
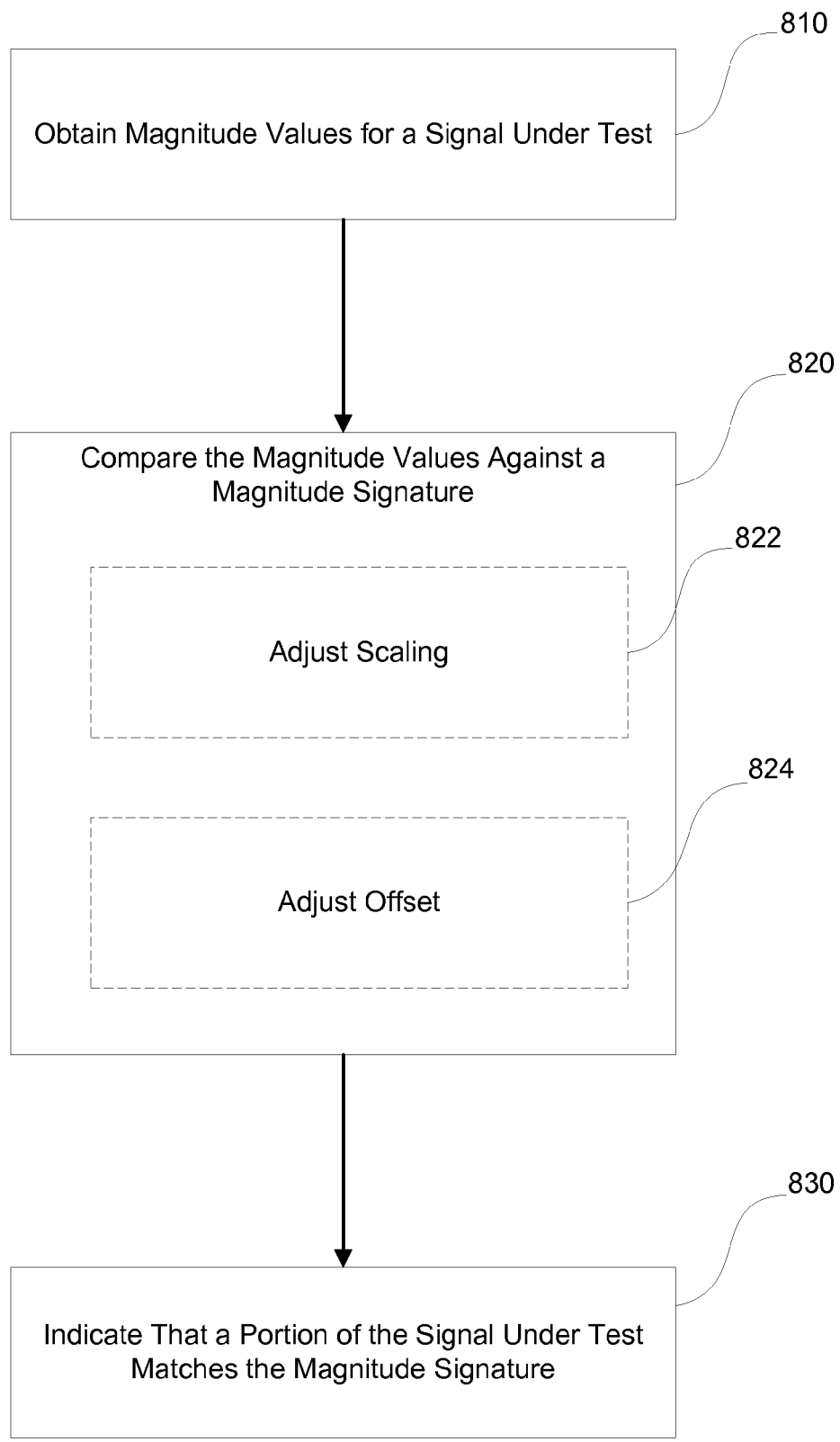
FIG. 8 is a flow diagram of an embodiment of the present method based upon a magnitude signature.

FIG. 8 illustrates a method of using a modulation signature, such as a magnitude signature, to identify when a portion of a signal under test matches the signature. As shown at step 810, magnitude values are obtained for a signal under test. These values could be obtained from an incoming signal, or from a storage medium. The magnitude values may be provided directly, or obtained by calculating them based on some other format such as I-Q data values. At step 820 the magnitude values are compared against the magnitude signature. In an embodiment of the present method, the comparison is achieved by shifting the magnitude values relative to the magnitude signature and comparing at each shift to see if there is a match that is within a threshold value. In some embodiments, the magnitude values are shifted, while in other embodiments the magnitude signature is shifted. As indicated by the dashed lines, step 822 and 824 are optional. At step 822, the scale is adjusted so that the magnitude values and the magnitude signature are close to the same scale. This may be achieved by calculating a scale value that minimizes the error computation. The shift value may be associated with either the magnitude values, of the magnitude signature. Similarly, at step 824, a relative offset is calculated. Once a comparison has been made, for example by calculating an error and comparing it to a threshold value, step 830 indicates that a portion of the signal under test matches the magnitude signature. In a first embodiment, the indication is provided by producing a trigger signal. In an alternative embodiment, the indication is provided by associating a marker with the portion of the magnitude values that correspond to the magnitude signature.

Figure 9:
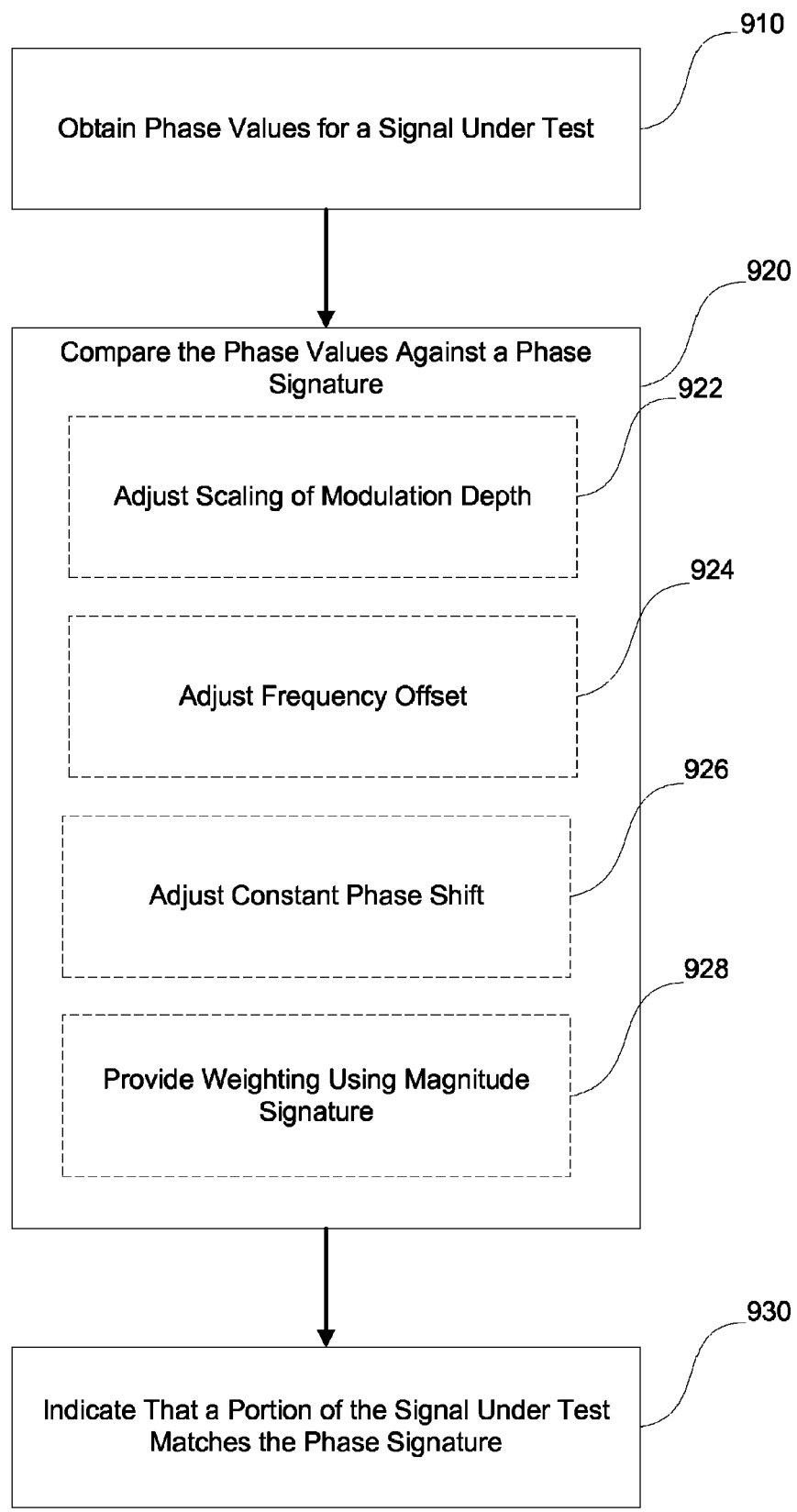
FIG. 9 is a flow diagram of an embodiment of the present method based upon a phase signature.

FIG. 9 illustrates a method of using a modulation signature, such as a phase signature, to identify when a portion of a signal under test matches the signature. As shown at step 910, phase values are obtained for a signal under test. These values could be obtained from an incoming signal, or from a storage medium such as a hard drive, USB drive, flash memory, etc. The phase values may be provided directly, or obtained by calculating them based on some other format such as I-Q data values. At step 920, the phase values are compared against the phase signature. In an embodiment, the phase values and the phase signature are compared against each other directly, and an error computation is performed. In an alternative embodiment, the phase signature is subtracted from the phase values and a straight line fit is performed to compare the values against each other. In an embodiment of the present method, the comparisons are achieved by shifting the phase values relative to the phase signature and comparing after each shift to see if a match is within a threshold value. In some embodiments, the phase values are shifted, while in other embodiments the phase signature is shifted. As indicated by the dashed lines, steps 922, 924, 926 and 928 are optional. At step 922, the scale of the modulation depth is adjusted to provide better comparisons. In a first embodiment, a scale value associated with phase signature is adjusted. In a second embodiment, a scale value associated with the phase values is adjusted. Similarly, at steps 924 and 926, a relative frequency offset or constant phase shift is calculated, respectively. Again, these can be calculated in relation to either the phase signature or the phase values. Either way, the relative relationship between the phase values and the phase signatures following these processes will minimize an error computation used to provide for the comparison. At step 928, a weighting factor based upon a magnitude signature that corresponds to the phase signature being applied is used to further reduce the error computation, by providing a weighting that reduces signal to noise ratio artifacts. Once a comparison has been made, for example by calculating an error and comparing it to a threshold value, step 920 indicates that a portion of the signal under test matches the phase signature. In a first embodiment, the indication is provided by producing a trigger signal. In an alternative embodiment, this indication is provided by associating a marker with the portion of the phase values that correspond to the phase signature.

Figure 10:
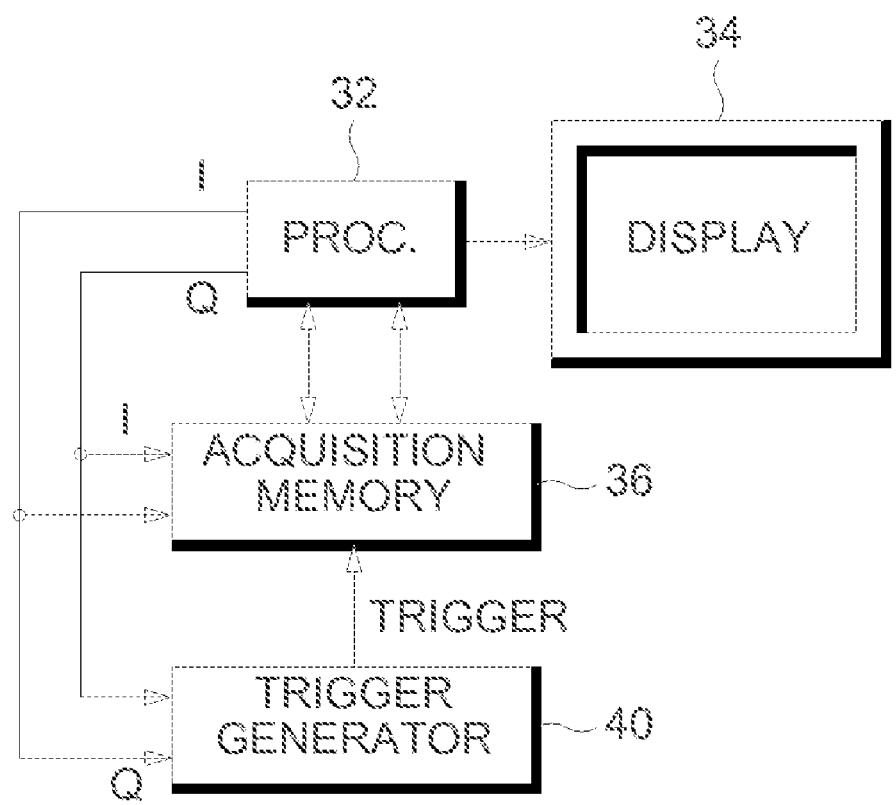
FIG. 10 is a block diagram illustrating the use of a trigger generator for post process analysis.

The embodiments described above relate to a real-time trigger that is implemented in hardware, such as an ASIC, FPGA or other customized circuitry. By implementing this in hardware, the comparison can be made and a trigger signal generated in real time, meaning that the trigger can be produced without dropping a sample or reducing the sample rate. In an alternative embodiment, these structures and operations can be implemented in software running on a programmable processor, such as a general purpose processor, a digital signal processor, or other processor capable of running software. This allows for post process analysis to identify matches to the modulation signatures. In a further embodiment, where hardware has been provided to perform this operation in real time, the trigger generator circuit 40 is used to provide post process analysis. In this embodiment, the processor 32 provides data from an acquisition memory 36, or other storage to the trigger generator 40. If a match is found to a modulation signature, the trigger signal is used to provide a marker associated with the stored signal. This can be accomplished by having the trigger write to the memory directly as shown in FIG. 10, or by providing a communication path (not shown) back to the processor 32.

Particular aspects of a signal under test can be found, or identified, by combining both phase signatures and magnitude signatures. For example, a phase signature trigger can be combined with a magnitude trigger by ANDing each comparators trigger signals to provide a resulting trigger signal when the logic condition is met. Alternatively, a trigger could be constructed by ORing phase signature triggers, and magnitude signature triggers.

In a further embodiment, the signature triggers described above could be implemented sequentially to find complicated triggers. The first trigger could use a first method, or a first signature, and subsequent triggers could use a different method, or signature, to construct a trigger system that would be able to find a portion of a signal under test containing more complicated signatures.

Modulation signature triggers may be useful to search a symbol pattern in a symbol sequence. Recent digital modulations use phase information to carry messages. However, absolute phase and absolute timing are often unknown to a receiver. To determine the absolute phase and time, finding fixed symbol patterns is helpful. Embodiments of the present invention simplify the pattern search. Ordinary symbol by symbol pattern search needs to prepare and compare all possible phase patterns. Especially, if the modulation type is Offset Quadrature Phase-Shift Keying (OQPSK), or similar modulation type, a conventional symbol search has to look at two types of decoded symbol sequences: In-Phase first symbol sequence and Quadrature-Phase first symbol sequence. Embodiments of the present invention deal with the half symbol shift by preparing the desired symbol signature at half symbols.

What is claimed is:

1. A test and measurement instrument comprising:
   a signal input to obtain magnitude values or phase values corresponding to a signal under test;
   a detector to compare the magnitude values, or the phase values against a modulation signature; and
   a comparator to generate a trigger signal when a portion of the signal under test matches the modulation signature;
   wherein the modulation signature is a phase signature; and
   wherein the detector compares the difference between the phase values of the signal under test and the phase signature.

2. The test and measurement instrument of claim 1, wherein the detector applies weighting based upon a magnitude signature corresponding to the phase signature.

3. A method comprising the steps of:
   obtaining magnitude values or phase values for a signal under test;
   comparing the magnitude values or phase values against a modulation signature; and
   indicating that a portion of the signal under test matches the modulation signature;
   wherein the step of comparing phase values against a modulation signature further comprises subtracting a phase signature from the phase values to obtain a phase differences signal.

4. The method of claim 3, further comprising calculating a straight line fit to the phase differences.

5. The method of claim 4, further comprising providing a magnitude signature along with a phase signature and applying a weighting factor based upon the magnitude signature when calculating the straight line fit.

* * * * *